United States Patent
Adusumilli et al.

(10) Patent No.: US 7,633,800 B2
(45) Date of Patent: Dec. 15, 2009

(54) REDUNDANCY SCHEME IN MEMORY

(75) Inventors: Vijay P. Adusumilli, San Jose, CA (US);
Nicola Telecco, Mountain View, CA (US)

(73) Assignee: Atmel Corporation, San Jose, CA (US)

( * ) Notice: Subject to any disclaimer, the term of this patent is extended or adjusted under 35 U.S.C. 154(b) by 84 days.

(21) Appl. No.: 11/835,572

(22) Filed: Aug. 8, 2007

(65) Prior Publication Data

US 2009/0040825 A1 Feb. 12, 2009

(51) Int. Cl.
*G11C 11/34* (2006.01)
*G11C 16/04* (2006.01)
*G11C 16/06* (2006.01)
*G11C 7/00* (2006.01)

(52) U.S. Cl. .............................. 365/185.09; 365/185.12; 365/189.12; 365/200

(58) Field of Classification Search ............ 365/185.09, 365/185.12, 189.12, 200
See application file for complete search history.

(56) References Cited

U.S. PATENT DOCUMENTS

| | | | |
|---|---|---|---|
| 4,731,737 A | 3/1988 | Witt et al. | |
| 5,003,465 A | 3/1991 | Chisholm et al. | |
| 5,084,838 A | 1/1992 | Kajimoto et al. | |
| 5,764,574 A | 6/1998 | Nevill et al. | |
| 6,567,335 B1 | 5/2003 | Norman et al. | |
| 6,760,255 B2 | 7/2004 | Conley et al. | |
| 6,914,817 B2 * | 7/2005 | Harari | 365/185.18 |
| 7,515,469 B1 * | 4/2009 | Chen et al. | 365/185.09 |

OTHER PUBLICATIONS

Intel, Using Intel Flash Memory: Asynchronous Page Mode and Synchronous Burst Mode, Appln. Note. 793, Aug. 2004, order No. 300783-001, pp. 28.

Atmel, "64-Megabit 2.7-volt Dual-interface DataFlash", AT45DB642D, Nov. 2005, pp. 13.

(Continued)

*Primary Examiner*—Ly D Pham
(74) *Attorney, Agent, or Firm*—Schwegman, Lundberg & Woessner, P.A.

(57) ABSTRACT

Column redundancy is provided outside of a FLASH memory chip using a separate companion controller chip. The companion chip initially receives and stores fuse address information from the FLASH memory chip for defective memory cells in the FLASH memory. In a read mode of operation, the companion control chip detects receipt of a defective address from the FLASH memory and stores in a redundant shift register redundant data that is downloaded from the FLASH memory chip. The redundant data is used to provide correct FLASH memory data to an external user that interfaces with the companion control chip. In a program mode of operation, the companion control chip provides redundant bits that are stored in redundant columns in the FLASH memory chip. The companion control chip provides flexibility by readily providing a number of different redundancy schemes for bits, nibbles, or bytes without requiring additional logic circuits in the FLASH memory chip itself. Data is transferred between the FLASH memory chip and the companion control chip a byte at a time.

19 Claims, 8 Drawing Sheets

OTHER PUBLICATIONS

Atmel, 16-Megabit (1M×16/2M×8) 3-volt Only Flash Memory, AT49BV-LV16×4A(T), Mar. 2002, pp. 26.
Atmel, "AT91 ARM Thumb Microcontrollers", AT91FR40162, Sep. 2005, pp. 24.
Amd, "Understanding Burst Mode Flash Memory Devices", Appln. Note, Publn. No. 23710, Rev. A, Mar. 23, 2000, pp. 5.
Samsung, "16M×8 Bit NAND Flash Memory", K9F2808U0C, May 6, 2005, pp. 31.
Xilinx, "Xilinx Generic Flash Memory Interface Solutions", May 8, 2001, pp. 12.

* cited by examiner

REDUNDANCY SCHEME IN MEMORY

TECHNICAL FIELD

The present invention relates to memory redundancy schemes and, in particular, to use of a companion controller chip to provide row and column redundancy functions for a memory chip.

BACKGROUND

Redundancy in a memory system is used to provide replacement memory cells for defective, or damaged, memory cells. The storage capacities of EEPROM and flash memories are being made larger to meet increasing memory requirements. Typically, EEPROM and flash memory devices are available in a single chip or single integrated circuit package configuration. A typical memory device integrated circuit package contains a memory array and a number of other circuits, including a memory controller or microcontroller and various other circuits that are used, for example, to address, program, and erase memory cells within the memory array.

Traditionally, replacement of defective memory cells with various redundancy schemes has been done in the memory chip itself close to the column (COL) and row (ROW) address decoding circuitry.

U.S. Pat. No. 6,760,255 to Conley et al. describes a non-volatile memory system in which a memory controller manages redundancy across multiple memory chips. Memory device defect data are discovered during manufacturing processes and are stored as a single record of information for each memory chip. The memory controller has access to this information and uses the defect data to redirect storage of user data around defective memory and into alternate locations.

U.S. Pat. No. 5,084,838 to Kajimoto et al. describes a plurality of memory integrated circuits mounted on a large-scale integrated circuit capable of coupling the memory circuits together. A plurality of redundant memory devices is incorporated to replace defective memory circuits. A redundant memory controller, a separate device, is used to monitor low-order address bits and coordinate use of redundant rows or columns to replace the corresponding locations in the defective memory circuits. The redundant memory controller uses previously stored alternate memory addresses to remap memory access at defective locations. Although the controller and memory circuits are integrated at a wafer level, operationally they are separate devices.

U.S. Pat. No. 5,764,574 to Nevill et al. describes a method and apparatus for independent redundancy programming of individual components of a multiple-component semiconductor device. A multiple-chip memory module includes a plurality of memory devices each having redundant circuitry for backend repair of defective memory cells. The redundant rows or columns are incorporated when a predetermined combination of programming signals are applied to specific terminals of the redundant device. A particular set of signal routing allows a separate device to manage substitution of redundant memory circuitry. In this way redundancy is incorporated across a memory system formed by a multiple device assembly.

The drawbacks of the prior art approach to having on-chip redundancy circuitry for larger and larger memories include increasing complexity and manufacturing costs for that extra circuitry. For certain memory structures, it is desirable to reduce or minimize control logic or control circuits that are located on the memory device chip. It is also desirable to minimize the number of memory pins used for interfacing with a host interface circuit.

SUMMARY

A method provides column redundancy with a separate companion control chip for reading a FLASH memory chip. The method includes transferring normal data bytes and redundant column data bytes from the Flash memory chip into a page register in the Flash memory chip. The redundant column data bytes contain one or more correct bits for corresponding defective FLASH memory cells. The method includes transferring to a shift register in the companion control chip the redundant column data bytes from the page register in the Flash memory chip; fetching into the companion control chip the normal data bytes from the page register of the FLASH memory chip; and checking in the companion control chip if an address for a fetched normal data byte is for a defective memory location.

If none of the bits of a fetched normal data byte is from a defective memory cell, that normal data byte is stored in a page register in the companion control chip. If at least one of the bits of the fetched normal data bytes is from a defective memory cell, the normal data byte is combined in the companion control chip with a corresponding redundant data byte to provide a correct data byte with correct bits for an external user.

Another method provides column redundancy with a separate companion control chip for programming a FLASH memory chip with incoming data bits. The method includes storing addresses for defective FLASH memory cells in the separate companion control chip and comparing addresses of incoming data bits to the addresses for defective FLASH memory cells. If an incoming data bit for a defective FLASH memory cell is received, a corresponding data bit is stored in a redundant byte register in the companion control chip. The method includes transferring data bytes for all non-defective memory cells into a page register in the FLASH memory chip, and subsequently transferring the contents of the redundant byte register into redundant columns in the page register in the FLASH memory chip.

Another embodiment includes a method that uses a separate companion control chip for column redundancy for one or more defective memory cells of a non-volatile memory device. The method includes storing addresses for defective FLASH memory cells in the separate companion control chip.

For a read mode of operation, the method includes transferring to a shift register in the companion control chip the redundant column data bytes from the page register in the Flash memory chip; checking in the companion control chip if an address for a fetched normal data byte is for a defective memory location. If at least one of the bits of the fetched normal data bytes is from a defective memory cell, the method includes combining in the companion control chip the normal data byte with a corresponding redundant data byte to provide a corrected data byte with correct bits. The method also includes reading out to an external user the data bytes from non-defective memory cells and corrected data bytes.

For a program mode of operation, the method includes comparing addresses of incoming data bits to the addresses for defective FLASH memory cells. If an incoming data bit for a defective FLASH memory cell is received, a corresponding data bit is stored in a redundant byte register in the companion control chip. Data bytes for all non-defective memory cells are transferred into a page register in the FLASH memory chip. Subsequently, the contents of the redundant byte register are transferred into redundant columns in the page register in the FLASH memory chip.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Flash and EEPROM devices require control circuitry to perform read, erase, and program operations. It is sometimes more efficient to provide a number of memory control circuits in a separate companion control chip and in order to minimize the required control logic within a separate memory chip.

Figure 1:
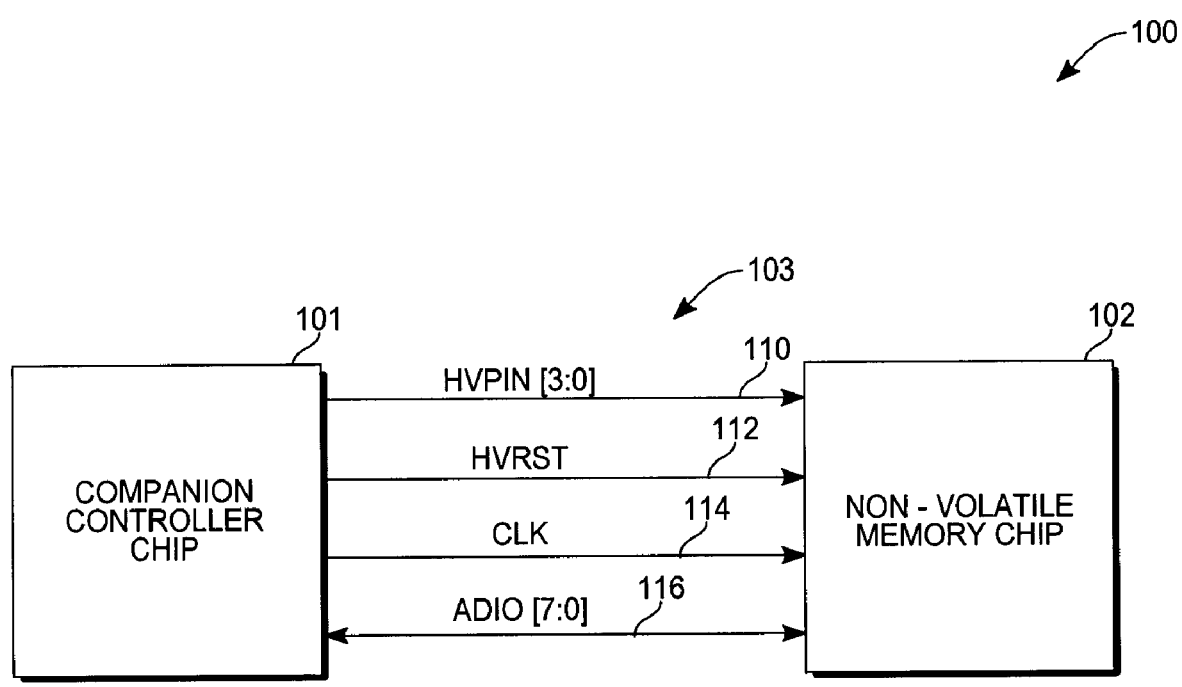
FIG. 1 is a Block diagram of a non-volatile memory system having a companion control chip that interfaces with a non-volatile memory chip.

FIG. 1 shows a non-volatile memory system 100 that includes a companion control chip 101 and a non-volatile memory device 102. U.S. patent application Ser. No. 11/393, 549 entitled "Off-Chip Micro Control and Interface in a Multichip Integrated Memory System" by Adusumilli et al., filed Mar. 29, 2006, and assigned to the assignee of the present application is hereby incorporated by reference. This document discloses a dual chip interface between a FLASH only memory device and a companion control chip. The companion control chip 101 provides an external interface to a user, (not shown), for example, such as a computer, etc. The companion control chip 101 controls various operations performed or interacting with the non-volatile memory device 102.

An exemplary communication and memory control interface 103 provides required control as well as data and address signals between the companion control chip 101 and the non-volatile memory device 102. The companion control chip 101 may be a microcontroller, a state machine, or other circuitry that is configured to interface with the single non-volatile memory device 102 or with multiple non-volatile memory devices, as required. The non-volatile memory device 102 is, for example, a non-volatile memory array such as a 256 Mbit flash memory or EEPROM device that includes circuitry or logic that supports the communication and memory control interface 103. The present invention is not limited to any particular memory size.

The communication and memory control interface 103 includes the following: a high voltage 4-line interface bus 110 (HVPIN) that provides high voltage control signals to the memory array or memory device 102; a high voltage reset interface line 112 (HVRST) that provides reset information to the memory device 102; a clock (CLK) line 114 that provides timing information to the memory device 102; and an 8-line address, data, and command interface (ADIO [7:0]) bus 116 that provides bidirectional command, data, and address information between the companion controller 101 and the non-volatile memory device 102. The companion controller chip 101 provides a clocking or timing signal on the clock line 114.

In one embodiment of the memory control interface 103, the high voltage 4-line interface bus 110 provides four high-voltage pins or signal lines to control various operations of the memory array (not shown) within the memory device 102. Signaling information presented on the high voltage interface 103 is generated and controlled by the companion control chip 101.

The address, data, and command interface bus 116 includes eight bidirectional multiplexed address/data/control signal lines that are used to exchange commands, memory array address information, and memory array data. The address, data, and command interface bus 116 is also used to reset the memory device 102, to send commands, or to change operating modes of either the companion control chip 101 or the memory device 102. The companion control chip 101 sends a command to the memory device 102 that changes the mode of the address, data, and command interface 116. For example, if the companion control chip 101 signals the memory device 102 that the address, data, and command interface bus 116 will be operating in a unidirectional mode, the companion control chip 101 sends an address to the memory device 102, thereby suspending the memory device 102 from sending to the companion control chip 101 during the send address operation. Also, the address, data, and command interface bus 116 may multiplex any commands, addresses information, or data information on the address, data, and command interface bus 116 lines.

The high voltage reset interface line 112 (HVRST) is implemented on a single interconnect line, and is used to reset the memory device 102 by applying a high-voltage that is greater than the voltage of a high logic value or the voltage representing a "one" logic value. The high-voltage for either the high voltage reset interface line 112 (HVRST) or the high voltage interface 110 (HVPIN) is generated by a circuit (not shown) external to the controller 101 and memory device 102, or may be generated by the controller 101. The memory device 102 also latches the high-voltage reset signal. The high voltage reset interface line 112 serves as a command or mode enable indicator when signaling is used in the range of 1.8 V to 0 V.

The high voltage reset interface line 112 may also be used to transmit standard logic signals. For example, the high voltage reset interface line 112 may be used as a signal line to indicate to the memory device 102 to operate in a pre-selected mode of operation. The direction of the signaling on the address, data, and command interface bus 116 pins or lines may be determined by the pre-selected mode of operation. The direction of signaling on the address, data, and command interface bus 116 pins or lines may also be determined by sending a command from the companion control chip 101 to the memory device 102 via the address, data, and command interface 116.

The VDD and GND voltages are common to both the chips, which can be shorted together depending on the voltage path (2.5 or 3.3V) we take. The ADIO pins are all by default set in the input mode unless the mode control changes to a different mode and the command refers to either read data out or status out. Once set, the direction of the ADIO is fixed until a new command is asserted.

The reset of the memory chip 102 is used to initialize the internal registers and to reset state machines in the memory chip 102, if needed. An initialization reset is not provided at the same time as power-on of the two chips but is delayed by the companion control chip. During a reset time, information from the redundancy fuses and configuration fuses in the memory chip 102 are downloaded into the companion control chip 101. This fuse information is retained throughout normal operation. This is done using an init mode of operation. This fuse information is used in the companion control chip 101 to dynamically replace or change data from defective memory cells with redundant data from redundant memory cells during data flow operations.

Table 1 includes a listing of exemplary command functions, the exemplary control codes or operational codes, the effect on the address, data, and command interface ADIO[7:0] bus 116 and general comments about each function or control code. For example, an erase operation has no effect on the address, data, and command interface bus 116 with regard to the communication direction or the signaling provided on the address, data, and command interface 116.

TABLE 1

| Control [7:0] | ADIO [7:0] | Function | Comments |
|---|---|---|---|
| 8'b0000_0000 | | Idle | Idle mode |
| 8'b0000_0001 | IO pads are configured as input | Initmode | Required fuses are loaded into the latches in this mode (fuses can be configuration latches) |
| 8'b0010_0000 | — | Read | Sets the global Read signal and indicates a start of 'Read' operation; 1 cycle |
| 8'b0100_0000 | — | Progm | Sets the global Program signal and indicates a start of 'Program' operation; 1 cycle |
| 8'b1000_0000 | — | Erase | Sets the global Erase signal and indicates a start of 'Erase' operation; 1 cycle |
| 8'bLLLL_1000 | | Mctrl | Micro control signals required during Read, Erase, and Program operations |
| 8'b0000_0111 | IO pads are configured as input | DataIN | Data Input mode done after program cmd and input address |
| 8'b0000_1011 | IO pads are configured as output mode | DataOut | Data output mode after Read/Mctrl |
| 8'b0000_1111 | IO pads are configured as input | AddIN | Input address in this mode is latched |

Figure 2:
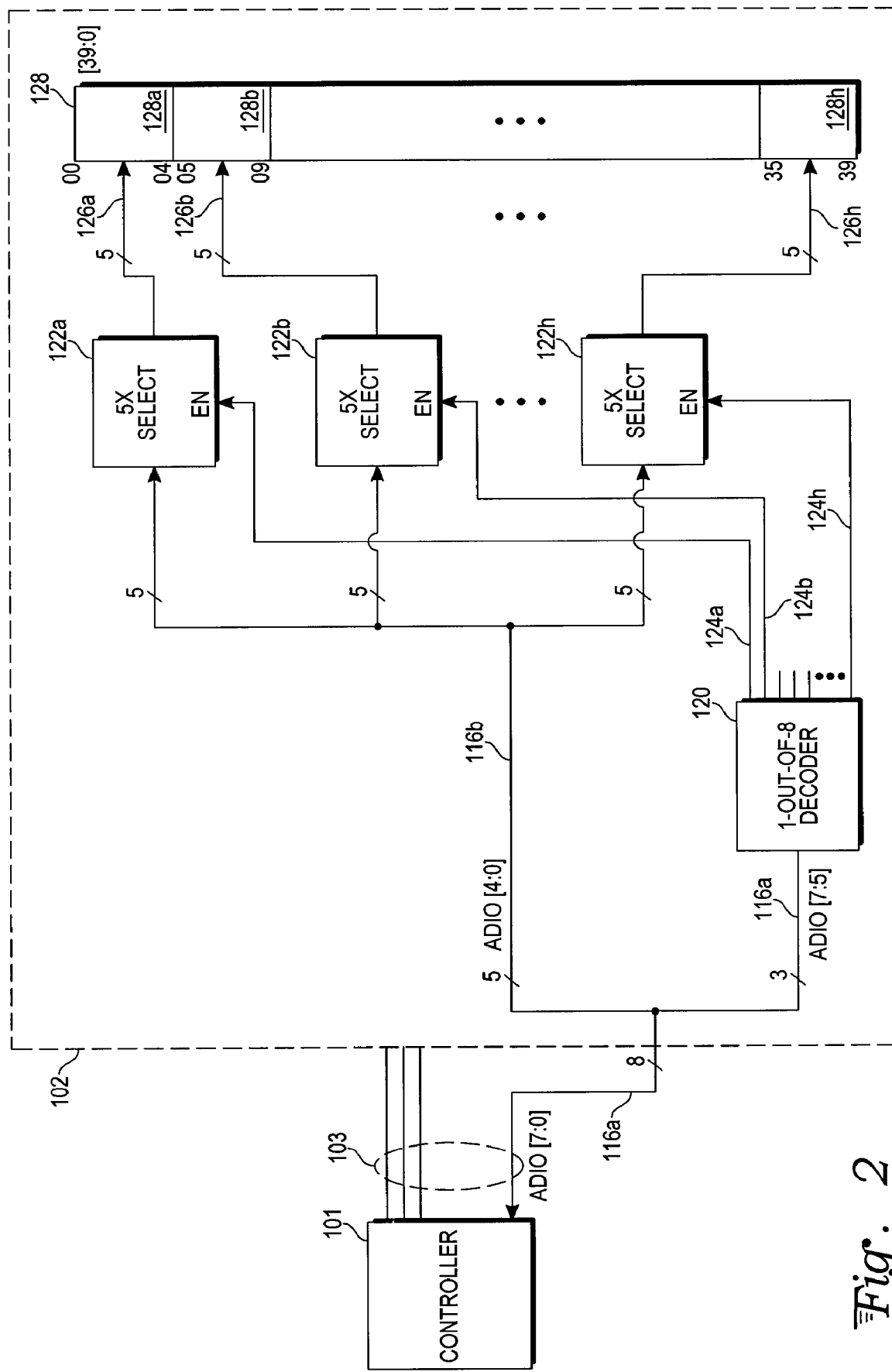
FIG. 2 is a more detailed Block diagram of interface circuitry in the non-volatile chip.

FIG. 2 illustrates in more detail the interface 103 and circuitry within the non-volatile memory device 102.

The companion control chip 101 is connected to the memory device 102 through the memory control interface 103. The eight lines of the address, data, and command interface (ADIO [7:0]) bus 116 are segregated into group code lines (ADIO [7:5]) 116a composed of three high-order bit positions and control data lines (ADIO [4:0]) 116b composed of five low-order bit positions. The group code lines 116a connect to input terminals of a 1-out-of-8 decoder 120. The control data lines 116b connect in parallel to input terminals of each of eight 5X selectors 122a, 122b, ... 122h.

From the output terminals of the 1-out-of-8 decoder 120, each one of eight 1-out-of-8 select lines 124a, 124b, ... 124h connect respectively to an enable input pin EN of a corresponding one of the 5X selectors 122a, 122b, ... 122h. Each of the 5X selectors 122a, 122b, ... 122h produces five output lines forming one of eight control-data-line groups 126a, 126b, ... 126h. Each one of the control-data-line groups 126a, 126b, ... 126h connects to a corresponding one of eight control groups 128a, 128b, ... 128h within a control register 128. Each of the control groups 128a, 128b, ... 128h spans a range of five bit positions. A low order control group 128a spans bit positions [4:0], six intermediate control groups span bit positions [5:34], and a high order control group 450h spans bit positions [35:39] for a total of 40 bit positions in the control register 128 spanning positions [39:0].

In a micro control mode (corresponding to the Mctrl function described supra), a group code, carried by the group code lines 116a, is decoded to provide a selection signal (not shown) on one of the 1-out-of-8 select lines 124a, 124b, ... 124h to the enable input pin EN of the corresponding one of the 5X selectors 122a, 122b, ... 122h.

A set of control data (exemplified infra) on the control data lines 116b is enabled for propagation to the corresponding one of the control groups 128a, 128b, ... 128h by the selection signal. The selection signal, applied to the selected one of the 5X selectors 122a, 122b, ... 122h, enables propagation of the control data through the one of the control-data-line groups 126a, 126b, ... 126h coming from the selected 5x selector. In this way the control data is propagated to one of the control groups with a corresponding group code. By cycling through a sequence of group codes and supplying a corresponding set of control data for each group code, a complete control word is assembled in the control register 128.

Table 2 correlates the group codes 116a and exemplary control data received in a corresponding one of the control groups 128a, 128b, ... 128h.

TABLE 2

| Bit Positions | | | | | | | | |
|---|---|---|---|---|---|---|---|---|
| [7] | [6] | [5] | [4] | [3] | [2] | [1] | [0] | FIG. 2 Labels |
| Group Code | | | Control Data | | | | | Control Group |
| 0 | 0 | 0 | 1 | 1 | 1 | 1 | 1 | 128a |
| 0 | 0 | 1 | 1 | 0 | 1 | 0 | 1 | 128b |
| ... | ... | ... | ... | ... | ... | ... | ... | ... |
| 1 | 1 | 1 | 0 | 1 | 0 | 0 | 0 | 128h |

With all group code entries, other than those listed above, having a control data value of 00000, a control word is formed in the control register 128 of value: [39:0] 01000_00000_ 00000_00000_00000_00000_10101_11111

In system operation, a group code value is decoded in one clock cycle and the control data is latched in the respective control group of the control register 128 in a second cycle. For eight control groups 16 clock cycles are required to load a 40 bit control word. The 40 bits of the control word are used to perform all essential programming and reading operations within the memory device 102.

Figure 3:
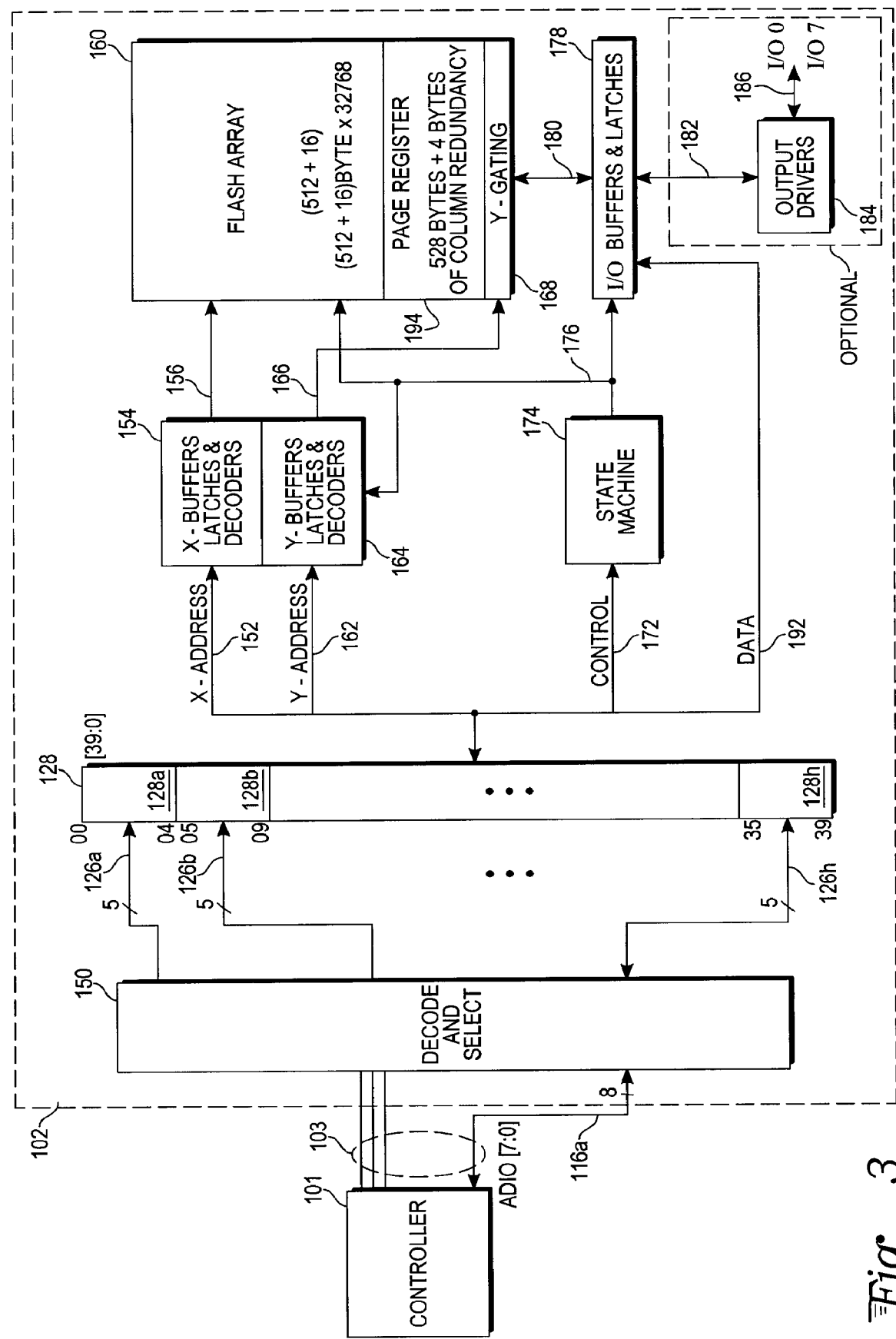
FIG. 3 is a Block diagram of the non-volatile memory system with more detail for the memory chip.

FIG. 3 is a Block diagram of the non-volatile memory system 100 of FIG. 2 with more detail for the memory chip 102. This figure shows the companion control chip 101 that communicates with the memory chip 102 through the memory control interface 103. The non-volatile memory device 102 is shown in the figure with a decoder and select circuit 150. The decoder and select circuit 150 includes the 1-out-of-8 decoder 120 and the eight 5X selectors 122*a*, 122*b*, . . . 122*h*, that are both shown in more detail in FIG. 2. Each of the 5X selectors 122*a*, 122*b*, . . . 122*h* produces five output lines that form one of eight control-data-line groups 126*a*, 126*b*, . . . 126*h*. Each one of the control-data-line groups 126*a*, 126*b*, . . . 126*h* is connected to a corresponding one of eight control groups 128*a*, 128*b*, . . . 128*h* within the control register 128. As previously described, each of the control groups 128*a*, 128*b*, . . . 128*h* spans a range of five bit positions. A low order control group 128*a* spans bit positions [4:0], six intermediate control groups span bit positions [5:34], and a high order control group 450*h* spans bit positions [35:39] for a total of 40 bit positions in the control register 128 spanning positions [39:0]. The bits of the control register 128 are used to perform all of the essential program (write) and read operations within the memory device 102. In one embodiment, 16 clock cycles are required to load the control register using 2 clock cycles per Block of 5 control bits in the control register 128.

The control register 128 provides various row or x-address signals on an X-address bus 152 to an x-address circuit 154 that includes x-buffers, latches, and x-decoder circuits. The output signals from the x-decoders are provided on a bus 156 to various rows of a flash memory array 160.

The control register 128 also provides various column or y-address signals on a Y-address bus 162 to a y-address circuit 164 that includes y-buffers, latches, and y-decoder circuits. The output signals from the y-decoders are provided on a bus 166 to a Y-gating circuit 168.

The control register 128 further provides control signals on a control bus 172 to a state machine 174. The state machine 174 provides control signals on a control bus 176 to the x and y address circuits 154, 164, the flash array 160, and to an I/O buffers and latches circuit 178. The circuit 178 is connected through a 2-way bus 180 to the I/O terminals of the y-gating circuit 168. The circuit 178 is also optionally connected through a 2-way bus 182 to output driver/interface circuits 184 for the input/output column bits I/O [7:0] that are provided on a 2-way I/O bus 186.

The control register 128 also provides and receives data signals on a data bus 192 that is connected to the I/O buffers and latches circuit 178.

A page register 194 is provided between the flash memory array 160 and the y-gating circuit 168. The Flash memory array 160 is organized as pages of 528 bytes, where 512 bytes are data and 16 additional bytes are provided as out-of-band spare bytes that are used to manage data integrity of a page. These extra bytes are used to mark bad blocks, for checksums, error correction codes, etc.

Figure 4:
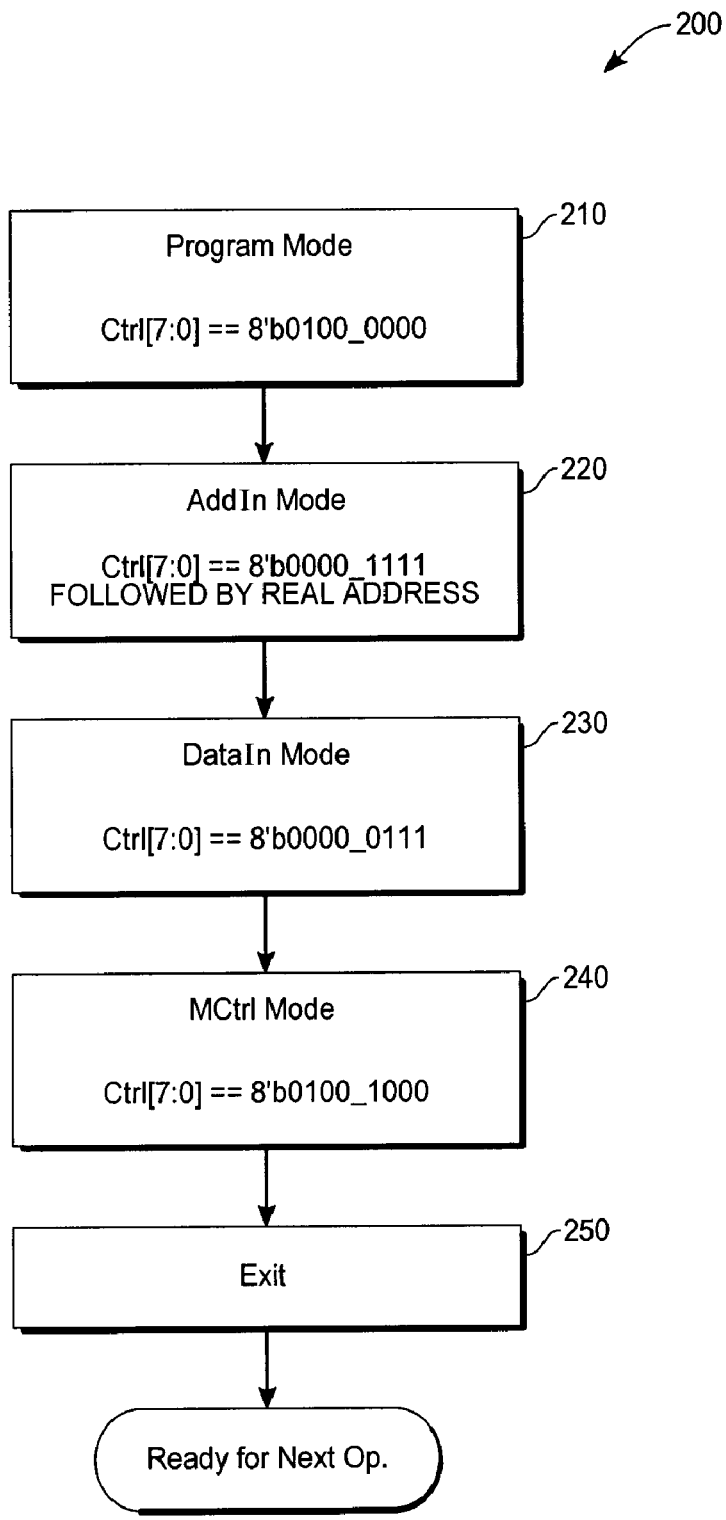
FIG. 4 is a flow chart for operation of the non-volatile memory system.

Referring to FIG. 4 and with reference to FIGS. 1, 2, and 3, a flowchart 200 for an exemplary program operation begins with the submission of a program operation or control code being transmitted on the address, data, and command interface bus 116 by the companion control chip 101. The companion control chip 101 initially instructs in Block 210 the memory device to operate in a program, or write, operational mode to program a selected memory cell or selected range of memory cells within the memory device 102. According to this first Block, global signals may be set within the memory device 102 or a general reset operation may also be performed within the memory device.

Next, in Block 220 the companion control chip 101 instructs in step 220 the memory device 102 to operate in an incoming address mode (AddIn) where, for example, the command is followed by a specific address or address range for a predetermined number of clock cycles. In a specific example, an incoming address mode command is sent to the memory device 102 followed by a specific 32-bit address over a period of four clock cycles where eight interface lines are used to implement the address, data, and command interface 116. Generally, when the memory device 102 is operating in an incoming address mode, a complete address or address range is latched by the memory device 102 into column and row address registers.

In Block 230, after the memory device 102 has latched the address, the companion control chip 101 instructs the memory device 102 to operate in an incoming data mode (DataIn). The incoming data mode command is followed by the specific data bytes that are to be loaded or programmed into the memory array of the memory device 102. The specific data are then programmed or stored in the page register of the memory chip 102 at the address or location specified during the program operation.

In Block 240 the companion control chip 101 may instruct the memory device 102 to operate in a microcontrol MCTRL mode that enables the memory device 102 to receive micro control signals from the companion control chip 101. The micro control mode of operation allows the controller 101 to control portions of the memory array or other portions of the memory device 102, such as, for example, an internal sense amplifier. During the micro control mode of operation, the companion control chip 101 may also request a variety of status indicators if required. Status indicators vary depending on the particular instruction. For example, in this case of a program operation, the companion control chip 101 may request how many internal programming cycles have been performed. After a program or other operation has been completed, Block 250 indicates that the single operational mode is exited and the memory device 102 and the companion control chip 101 are ready to implement a next operation. At exit Block 250, the companion control chip 101 or the memory device 102 may automatically initiate an internal reset command. Alternatively, a reset is made part of a soft reset in a microcontroller operation.

Redundancy Logic

By using the companion control chip 101, column and row redundancy are both performed outside the memory chip 102. 8 blocks are available to support row redundancy and 32 redundant column bits, or 4 bytes, are available for date replacement to support column redundancy. The addresses of damaged rows and columns are found during back-end testing. These addresses for damaged memory cells are then stored in fuses in the memory chip 102. On reset, the companion control chip 101 reads the fuse information stored in the memory chip 102 and then stores the information provided by the fuses in the companion control chip 101.

Row redundancy requires that the redundant address bits be stored in the FLASH memory after back-end production testing. The number of bits thus required for addressing a defective row Block is calculated as follows: The number of address bits required in addressing a Block is 10 bits+1 Set/Enable bit. The number of Redundant blocks/plane is 4. The number of planes per chip is 2. The total number of address bits required in this scheme is 88 bits.

When column redundancy is implemented to replace a 'bad' nibble that has bad bit lines, it is possible to calculate the number of address bits that need to be stored in the fuses, as follows: The number of bits required to address a nibble within a page is 12 (10 Col bits+1 nibble location+1 Set/Enable bit). The number of nibbles per column is 8 nibbles. The number of planes within the memory is 2. The total number of address bits required in this scheme is 8×12×2=192 bits.

The total number of bits stored in the memory with the current architecture is 192+88, or 280 bits, or 35 bytes for both row and column redundancy.

ROW Redundancy

To replace a damaged row, the companion control chip 101 uses address substitution to provide a modified address to the memory chip whenever a user operates on a damaged row. A damaged Block is replaced with one of the available 4 redundancy blocks. The companion controller chip 101 masks a damaged row by dynamically converting its original address to a new address. The new address is provided to the memory chip during read/write operations. Alternatively, the companion chip provides the address to a user during status reads. The internal address is different from the external address, which is treated as a virtual address.

Figure 5A:
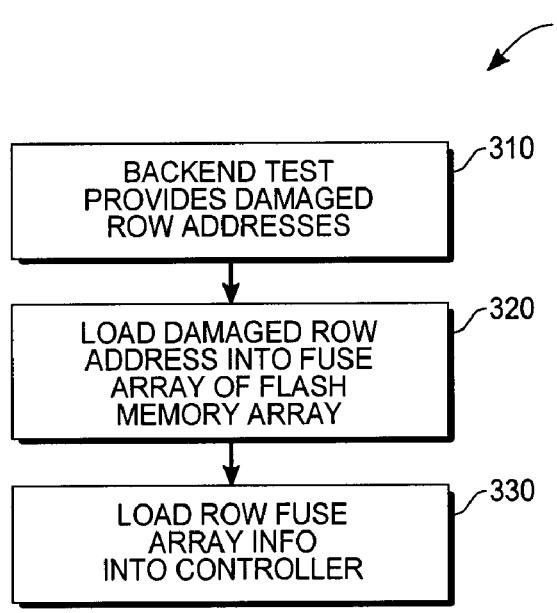
FIG. 5A is a flow chart illustrating detection of damaged rows and subsequent treatment of addresses for those damaged rows.

FIG. 5A is a flow chart 300 that illustrates detection of damaged rows and subsequent treatment of the addresses for those damaged rows. In Block 310, back-end testing produces the addresses of damaged rows. The process of capturing faulty, defective, or bad row addresses is a one time task and is done before a chip is distributed for normal use. In Block 320, the addresses of damaged rows are programmed into fuses in the FLASH memory chip. In Block 330, the address information of damaged rows stored in the fuses are loaded into the companion controller chip upon initialization of the memory system. Loading of the addresses of the damaged rows is done during a reset operation.

Figure 5B:
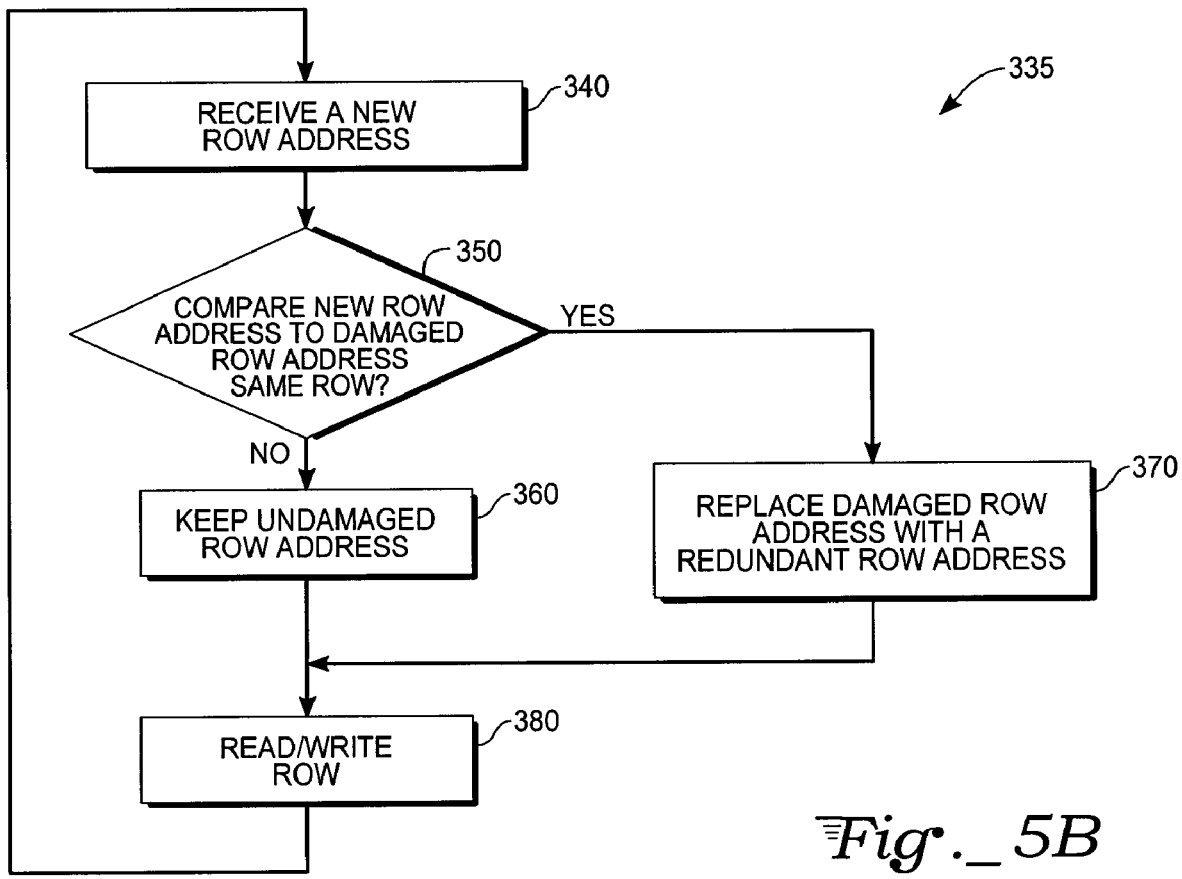
FIG. 5B is a flow chart illustrating row redundancy operation of the non-volatile memory system.

FIG. 5B is a flow chart 335 that illustrates row redundancy operation of the non-volatile memory system for each normal read operation. In Block 340 the companion control chip of the memory system receives a new memory row address. In a decision Block 350, the companion control chip compares row addresses that are attempting to access the FLASH memory to damaged row addresses. If a damaged row address is not accessed, Block 350 steers the system to a Block 360 that keeps the undamaged row address. If a damaged row address is accessed, Block 350 steers the system to a Block 370 that replaces the damaged row address with a redundant row address. In Block 380, the memory system proceeds to read or write data from/to the row having an address provided by Block 360 or to the redundant row having an address provided by Block 370. The system then returns back to Block 340 to continue to receive another new memory row address. The "real" address inside the memory array is masked and the companion control chip provides a virtual address.

Column Redundancy

For column redundancy, the present invention provides a technique that provides transparency to a user—that is, the user is not penalized for use of the invention.

Further the invention provides flexibility, that is, the external companion control chip provides, external to the memory chip, control of the particular redundancy scheme used (bit, nibble, byte, columns, etc.) without requiring any circuitry on the memory chip itself.

Regarding flexibility, because there is no specific redundancy hardware in the memory chip itself, the controller chip alone is easily changed to modify the particular type of column redundancy used on the memory chip.

Previously, one approach was to have redundancy in the memory chip itself. Requiring the memory chip itself to be flexible, that is, to be able to handle various types of redundancy schemes would require additional logic circuitry in the memory chip for each particular type of redundancy used—bit, byte, etc. Each type of redundancy would take up additional space on the memory chip. Flexibility is obtained by the companion control chip being able to readily assign to the memory chip a particular kind of column redundancy, such as single lines, bits, nibbles, bit line pairs, whole bytes, 32 columns, where the only limit is the number of redundant columns that are available. The memory chip therefore would not have to pay an additional space penalty for each type of column redundancy used. Thus, by utilizing the companion control chip, a number of different redundancy schemes are provided using the controller chip rather than the memory chip itself.

Column redundancy is implemented with the companion control chip 101 replacing a byte, a nibble, or a bit in the page register of the memory device. A damaged byte within the 528 total bytes of a page can be replaced with one of four available redundant bytes (32 bits). The 4 redundant bytes are organized as a 32-bit shift register in the companion control chip and the contents of the 32-bit shift register are shifted in/out of the page register in the memory chip during the microcontrol MCTRL mode. During a read mode of operation, these bytes are shifted out at the beginning of the microcontrol mode. During a program mode of operation, these bytes are shifted at the end of the micro control operation. The redundant byte information is acted on in the memory preemptively in either a program or a read operation. Since the number of control signals available for control during the microcontrol mode are limited, the column redundancy could have been implemented as a 32-bit parallel shift in, 4-bit shift out during a read operation. The shift out could also be a 1/4/8 bit shift out, depending on the interface between the memory and the companion chip. The present invention saves control signals because a shift operation only requires an enable signal and a clock signal. Similarly, during a program operation, the shift is performed as a 4 bit shift in and 32 bit shift out. Shift register organization reduces the logic inside the memory chip.

Replacement of the bytes within the page register in the memory chip are controlled by the companion control chip dynamically. Note that, for either a read operation or a program operation, 8 cycles are needed (a nibble per cycle) to shift in/out redundant data.

During a program or an erase operation, special care is needed for column redundancy. The micro control sequence for either a program operation or an erase operation requires one data-in cycle to be able to fill in "don't care" bits in the bit lines that are essentially replaced by redundancy information. The time for shifting in the data filling the page register adds latency time to the total time required for a program operation or an erase operation. These shift-in operations are to be performed by the micro-controller prior to an erase-verify or a program-verify portion of a microcontrol sequence, as needed.

Discovery of Bad Columns and Bad Column Address Retention

Figure 6A:
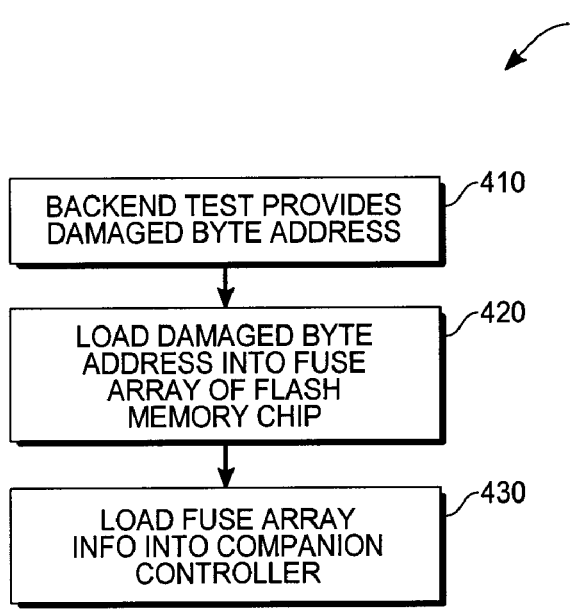
FIG. 6A is a flow chart illustrating detection of damaged columns and subsequent treatment of addresses for those damaged columns.

FIG. 6A is a flow chart 300 that illustrates detection of damaged columns and subsequent treatment of addresses for those damaged columns. In Block 410, back-end testing produces the addresses of damaged columns. The process of capturing faulty, defective, or bad column addresses is a one time task and is done before a chip is distributed for normal use. In Block 420, the addresses of damaged columns are programmed into fuses in the FLASH memory chip. In Block 430, the addresses of damaged columns are loaded into the companion control chip upon initialization of the memory system. Loading of the addresses of the damaged columns is done during a reset operation.

Column Redundancy Operation

Figure 6B:
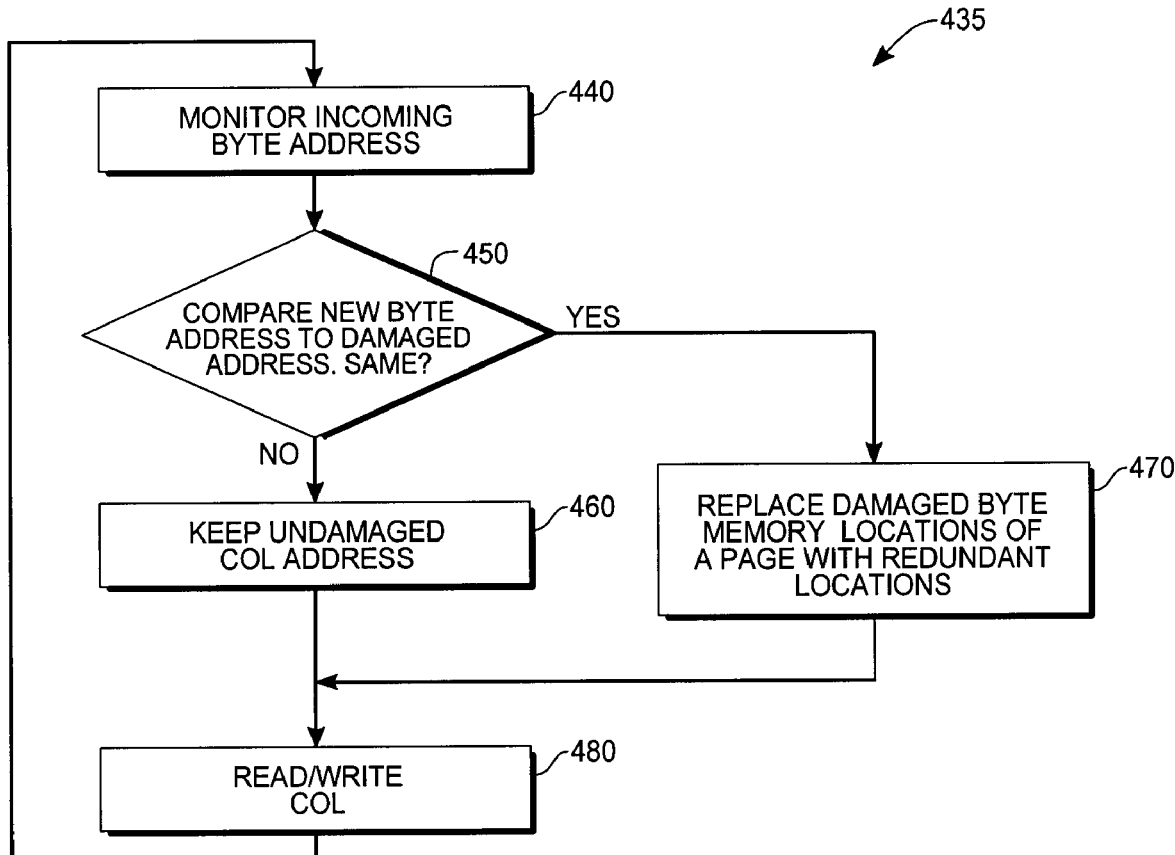
FIG. 6B is a flow chart illustrating column redundancy operation of the non-volatile memory system.

FIG. 6B is a flow chart 435 that illustrates column redundancy operation of the non-volatile memory system. In Block 440 the memory system receives a new memory column address. In a decision Block 450, the companion control chip compares column addresses that are attempting to access the FLASH memory to damaged column addresses. If a damaged column address is not accessed, Block 450 steers the system to a Block 460 that keeps the undamaged column address. If a damaged column address is accessed, Block 450 steers the system to a Block 470 that replaces the damaged column address with a redundant column address. In Block 480, the memory system proceeds to read or write data from/to the column address provided by Block 460 or to the redundant column address provided by Block 470. The system then returns back to Block 440 to continue to receive another new memory column address.

Read Mode

When a user wants to read data from the memory, a page of memory content, including normal data and redundant data, is transferred from the memory array into the page register 194 of FIG. 3 on the memory chip. The page register 194 on the memory chip has 512 normal data bytes plus 4 bytes of column redundancy. For a read mode of operation, the companion control chip 101 first fetches, byte by byte, the four column redundancy bytes and stores them in a 4 byte shift register in the companion control chip 101. The companion control chip 101 then fetches the page data from the page register byte by byte. The companion control chip gets 8 bits at a time from the page register in the memory chip. For each data byte transferred into the companion control chip 101, the companion control chip 101 checks the address for that byte using a look up table to see if that address is for a defective memory location. For a normal, non-defective memory address, the corresponding transferred data byte is stored in a page register in the companion control chip. For a byte associated with a defective memory address, the companion chip combines the byte received from the memory page register with the corresponding redundant byte using a table which identifies the addresses of the bit, nibble, or byte to be replaced in the page register byte by the appropriate bits in the redundant shift register in the companion control chip 101. The companion control chip then signals to the external user that the data can be read out to the user from the page register in the companion control chip. Using the scheme, defective bits, nibbles, bytes, columns, or column pairs (for shorts between columns) can be repaired. The companion control chip can be programmed to replace bits, nibbles, bytes, etc. as required without adding additional circuitry to the memory chip itself, thus providing flexibility to the redundancy scheme.

The control tells the user that the user can read data from the companion control chip. For the read mode of operation, the companion control chip transfers bytes one at a time from the page register in the memory chip and also checks whether a particular byte has "wrong" data, using a map of bad locations in the memory chip.

The addresses of bad data storage locations in the memory are pre-loaded in fuses in the memory chip at back-end testing. Upon start-up the fused address information is pre-fetched from the memory chip and loaded into the controller chip.

For the read mode of operation, the controller "combines" a page register byte and a correct byte using a lookup table which describes the addresses of whatever bad bit memory locations are to be replaced in a bad page byte with bits from a correct byte. Thus, the control chip replaces bad data bits with good bits for a redundant memory location.

Figure 7:
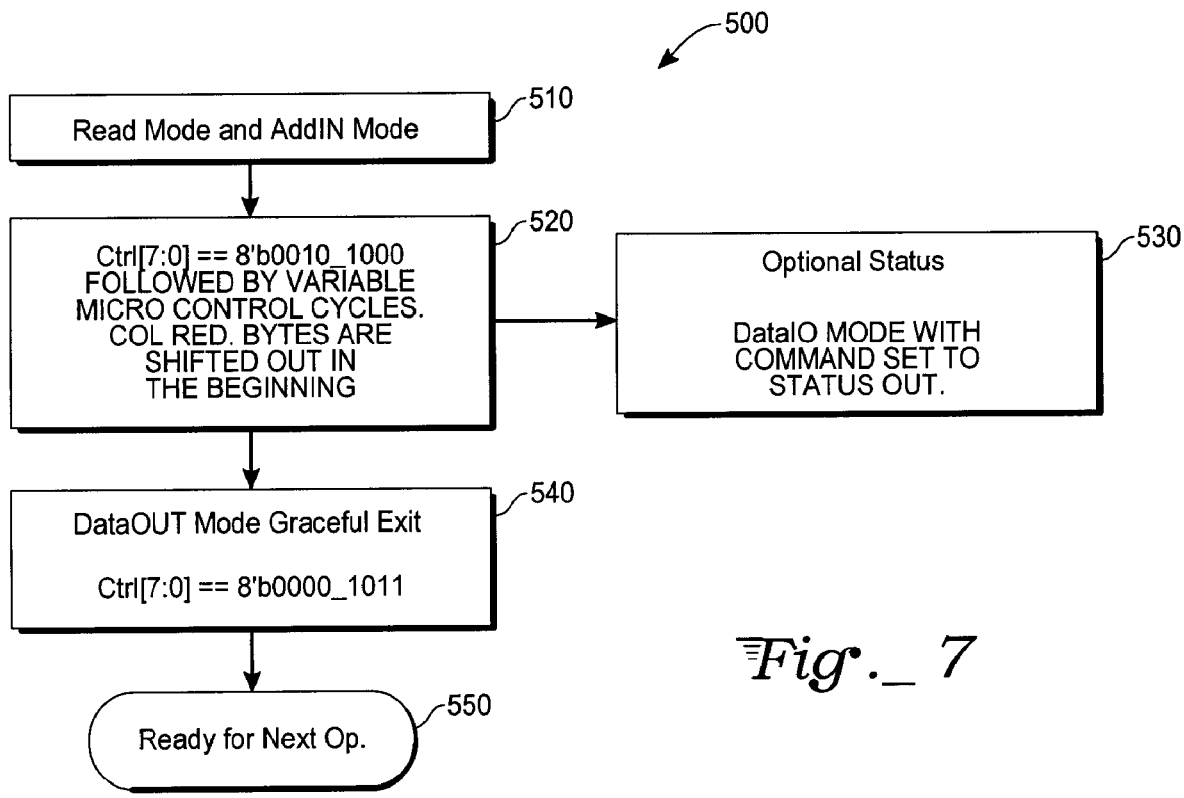
FIG. 7 is a flow chart illustrating a read mode of operation of the non-volatile memory system.

FIG. 7 is a flow chart 500 for a read mode of operation of the Flash memory 102 of FIGS. 1, 2, and 3. Redundancy address bytes are stored in fuses in the memory chip. Upon power up, the redundancy address bytes are clocked out of the fuses in the memory device 102 and latched in the companion control chip 101. When the data bytes are read out of the page register of the memory chip, the data bytes from the bad, or defective, memory cells, according to the pre-stored redundancy fuse information, are replaced dynamically with redundant data.

In Block 510, a global Read signal is set in one cycle by the Read command. Block 520 indicates a microcontrol mode is entered. Various microcontrol signals are then latched in "Mctrl" latches. Possible modes are Read, Program, Erase and are reflected in the 4 MSBs of the control operation. Column Redundancy bytes are shifted out at the beginning of the operation.

In Block 530, during a micro control mode of operation, the controller 101 may optionally request a variety of status indicators as required. In Block 540, a data output mode to an external user is entered. Block 550 indicates that the system is ready for another operation.

Program Mode

The companion chip keeps any redundant data bytes associated with bad memory cells in a set of four shift registers in the companion control chip. At the beginning of loading a page of data into the page register of the memory chip, the redundant bytes in the four shift registers are loaded from the shift registers in the companion control chip into the redundant columns of the page register in the memory itself.

If a host user sends in 8 good bits to the companion control chip, those 8 good bits flow into the page register in the memory chip. If one so called "bad bit" which is to be stored at a defective column address, is received from a host user, that bit is stored in a shift register in the companion control chip. Bad bits are masked with the good data stored in the shift register of the companion control chip.

Figure 8:
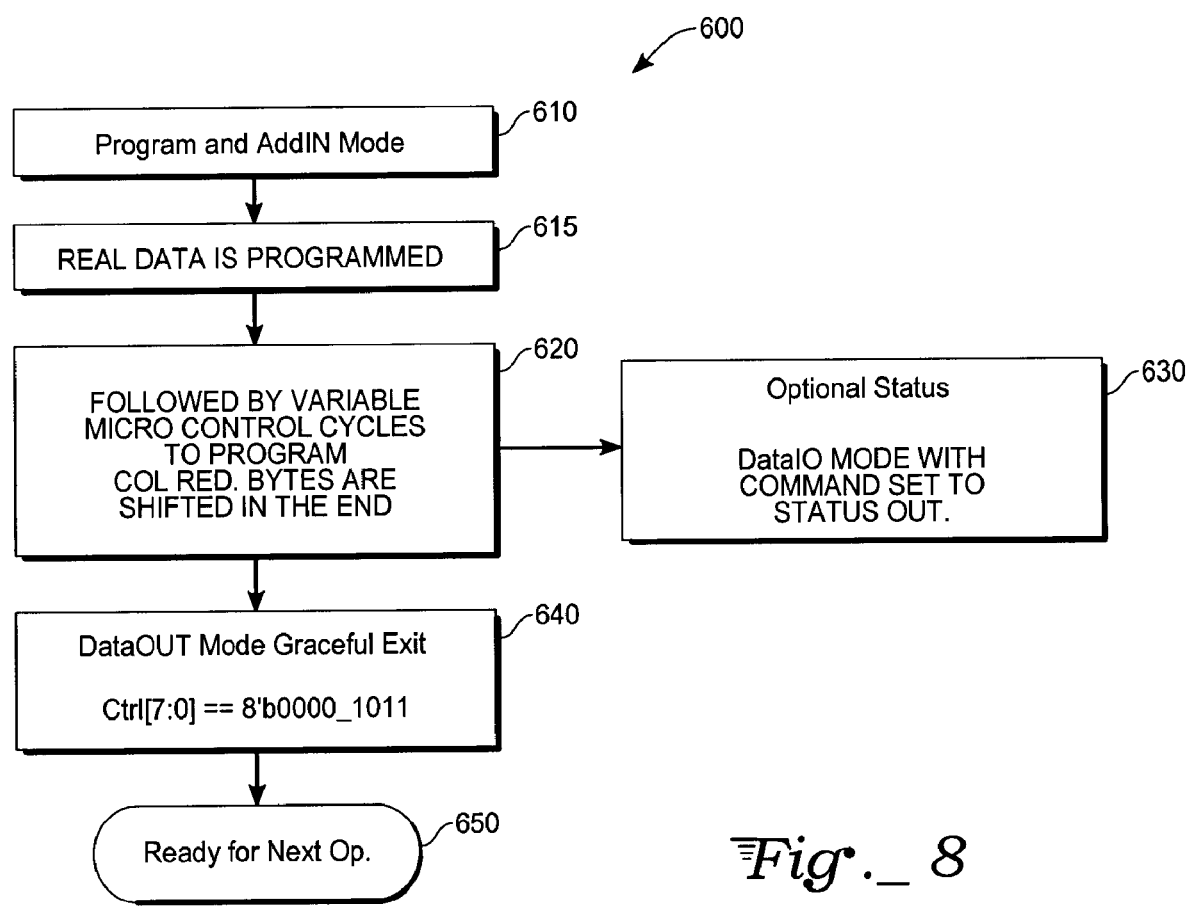
FIG. 8 is a flow chart illustrating a program, or write, mode of operation of the non-volatile memory system.

Recovery of redundant bytes from normal column data is done through the companion control interface chip. FIG. 8 is a flow chart 600 for a program, or write, mode of operation for the Flash memory 102 of FIGS. 1, 2, and 3. During a program mode of operation, the redundancy data bytes are clocked into the memory device from companion-control chip 101 before the normal data is cached in. This operation occurs between normal data cache operation and read program operation. Data for redundant column lines is intelligently sought out by the companion chip interface. When the normal data is programmed in, redundancy bytes are identified using the fuse information and stored into the temporary redundancy register which is clocked into the page register of the memory after the user has programmed the 512+16 normal data bytes.

In Block 610, a Program Command gets a global Program signal. The ADDIN command latches input addresses in the companion controller chip 101. Block 615 provides that read data is programmed in. Block 620 indicates that the Column Redundancy Bytes are shifted out of the 4-byte shift register in the companion control chip in the end of the operation. Various microcontrol signals are then latched in the "Mctrl" latches as reflected in the 4 MSBs of the control operation.

In Block 630, during a micro control mode of operation, the controller 101 may optionally request a variety of status indicators as required.

In Block 640, the Data output mode is entered. Block 650 indicates that the system is ready for another operation.

For the program mode of operation, user data is loaded into a set of page registers in the companion control chip. The companion control chip 101 then loads, byte by byte, the user data into the page register in the memory control chip 102. Data loaded to be stored in non-defective memory locations goes directly into the normal memory cells of the memory chip 102. If a user bit is to be stored in a defective memory location, that user bit is stored in one of the 4 redundant byte registers in the companion control chip 101. After all of the good data is loaded into the normal memory cells of the memory chip 102, the contents of the redundant shift registers are sent to the redundant columns of the page register by masking its address to the redundant columns in the memory chip 102.

Erase Mode

Figure 9:
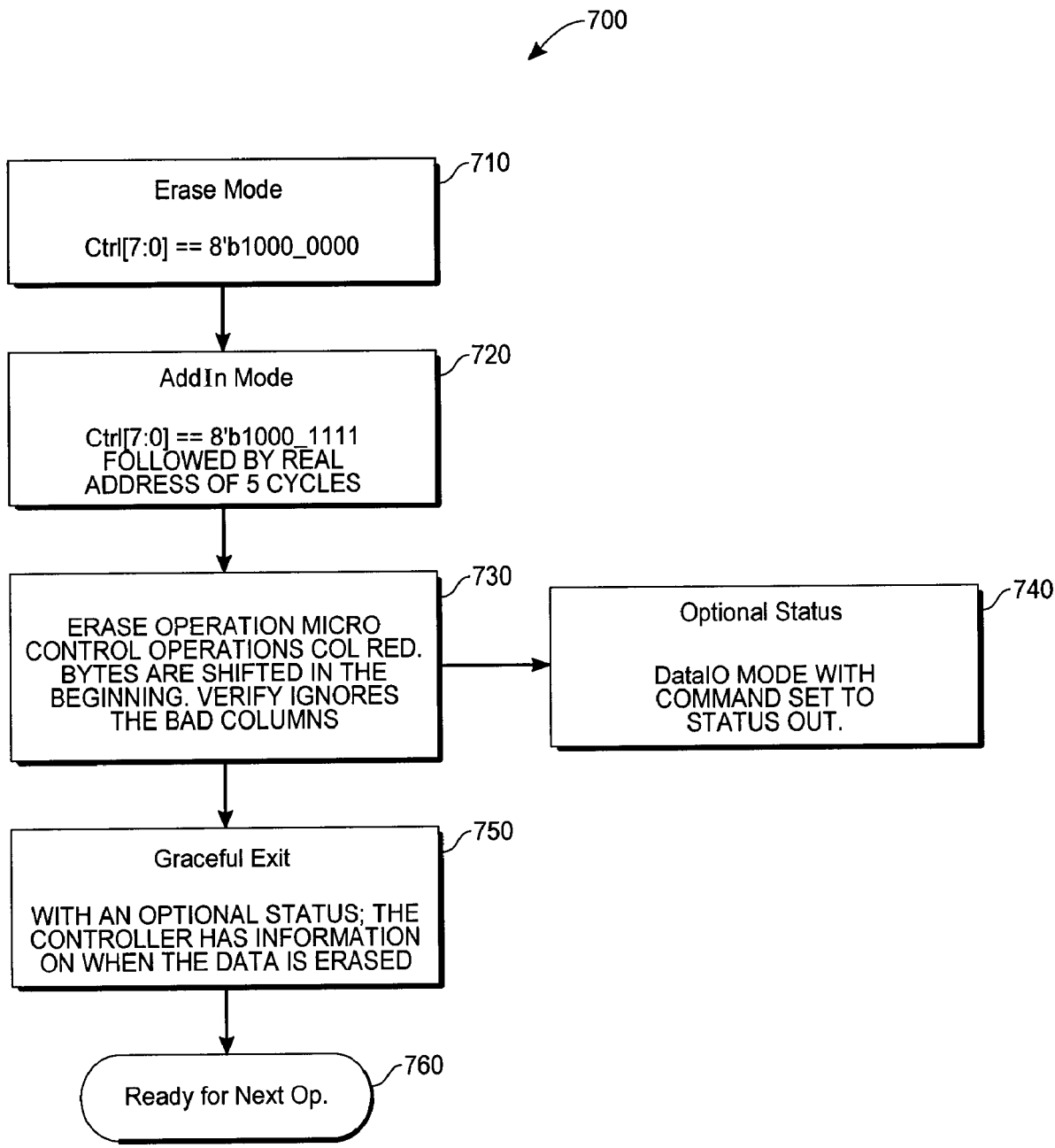
FIG. 9 is a flow chart illustrating an erase mode of operation of the non-volatile memory system.

FIG. 9 is a flow chart 700 for an erase mode of operation of the FLASH memory 102 of FIG. 1 and FIG. 2. An erase operation encompasses soft programming, row erase, and verify operations. The companion controller chip 101 initially puts the memory chip 102 in the erase mode in Block 710 allowing for the global signals to be set, then moves into the AddIN mode in Block 720, where the row address registers are all first loaded. In Block 730, the erase operation micro control operations erase the bits and redundancy col information is loaded in by programming the entire col register along with the redundancy bytes during the verify operation. The damaged columns are thus ignored during the verify operation. In Block 740, during a micro control mode of operation, the controller 101 may optionally request a variety of status indicators, as required. In Block 750 the erase mode is exited. Block 760 indicates that the system is ready for another operation. During the erase mode of operation, the companion chip intelligently programs the entire redundancy columns depending on the address that the user wants to program in.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method comprising:
transferring normal data bytes and redundant column data bytes from a Flash memory chip into a page register in the Flash memory chip, wherein the redundant column data bytes contain one or more correct bits for corresponding defective FLASH memory cells;
transferring to a shift register in a companion control chip the redundant column data bytes from the page register in the Flash memory chip, the companion control chip being separated from the Flash memory chip;
fetching into the companion control chip the normal data bytes from the page register of the FLASH memory chip;
checking in the companion control chip if an address for a fetched normal data byte is for a defective memory location;
if none of the bits of a fetched normal data byte is from a defective memory cell, storing that normal data byte in a page register in the companion control chip;
if at least one of bits of the fetched normal data byte is from a defective memory cell, combining in the companion control chip the normal data byte with a corresponding redundant data byte to provide a correct data byte with correct bits for an external user.

2. The method of claim 1 wherein checking in the companion control chip includes using a look-up table with the addresses of defective FLASH memory cells to determine redundant addresses for data bytes.

3. The method of claim 2 wherein the look-up table identifies the addresses of one or more bits, nibbles, or bytes to be replaced by appropriate bits stored in the redundant shift register in the companion control chip.

4. The method of claim 1 wherein data is fetched a byte at a time into the companion control chip the normal data bytes from the page register of the FLASH memory chip.

5. The method of claim 1 including determining the address of bad data storage locations and pre-loading those addresses into fuses in the memory chip.

6. The method of claim 3 including pre-fetching the addresses of defective Flash memory cells that are pre-loaded into fuses in the memory chip and loading those addresses of bad data storage locations into the companion controller chip.

7. The method of claim 4 including shifting the redundant bits out of the page registers during a micro control read mode of operation.

8. The method of claim 1 including packaging the separate control chip in the same integrated-circuit package as the memory chip.

9. A method comprising:
storing in a companion control chip addresses for defective FLASH memory cells of a FLASH memory chip, the companion control chip being separated from the FLASH memory chip;
comparing addresses of incoming data bits to the addresses for defective FLASH memory cells, wherein said comparing includes using a look-up table with the addresses of defective FLASH memory cells to determine redundant addresses for data bytes, and wherein the look-up table identifies the addresses of one or more bits, nibbles, or bytes to be replaced by appropriate bits stored in the redundant shift register in the companion control chip;
if an incoming data bit for a defective FLASH memory cell is received, storing a corresponding data bit in a redundant byte register in the companion control chip;
transferring data bytes for non-defective memory cells into a page register in the FLASH memory chip; and
subsequently transferring the contents of the redundant byte register into redundant columns in the page register in the FLASH memory chip.

10. The method of claim 9 wherein data is fetched a byte at a time into the companion control chip the normal data bytes from the page register of the FLASH memory chip.

11. The method of claim 9 including determining the address of bad data storage locations and pre-loading those addresses into fuses in the memory chip.

12. The method of claim 9 including pre-fetching the addresses of defective Flash memory cells that are pre-loaded into fuses in the memory chip and loading those addresses of bad data storage locations into the companion controller chip.

13. The method of claim 9 including shifting the redundant bits out of the page registers during a micro control read mode of operation.

14. The method of claim 9 including packaging the separate control chip in the same integrated-circuit package as the memory chip.

15. A method comprising:
   storing in a companion control chip addresses for defective FLASH memory cells of a FLASH memory chip, the companion control chip being separated from the FLASH memory chip;
   for a read mode of operation:
      transferring to a shift register in the companion control chip the redundant column data bytes from the page register in the Flash memory chip;
      checking in the companion control chip if an address for a fetched normal data byte is for a defective memory location;
      if at least one of bits of the fetched normal data byte is from a defective memory cell, combining in the companion control chip the normal data byte with a corresponding redundant data byte to provide a corrected data byte with correct bits;
      reading out to an external user the data bytes from non-defective memory cells and corrected data bytes;
   for a program mode of operation:
      comparing addresses of incoming data bits to the addresses for defective FLASH memory cells;
      if an incoming data bit for a defective FLASH memory cell is received, storing a corresponding data bit in a redundant byte register in the companion control chip;
      transferring data bytes for non-defective memory cells into a page register in the FLASH memory chip; and
      subsequently transferring the contents of the redundant byte register into redundant columns in the page register in the FLASH memory chip.

16. The method of claim 15 including transferring normal data bytes and redundant column data bytes from the Flash memory chip into a page register in the Flash memory chip, wherein the redundant column data bytes contain one or more correct bits for corresponding defective FLASH memory cells.

17. The method of claim 15 including fetching into the companion control chip the normal data bytes from the page register of the FLASH memory chip.

18. The method of claim 15 including if none of the bits of a fetched normal data byte is from a defective memory cell, storing that normal data byte in a page register in the companion control chip.

19. The method of claim 15 including:
   testing the memory device to find the defective memory cell in the memory device;
   storing in fuses in the memory device the memory cell address for the defective memory cell;
   transferring the address information of the faulty memory cell from the fuses in the memory device into the control device.

* * * * *